United States Patent [19]

Anderson

[11] Patent Number: 5,031,069

[45] Date of Patent: Jul. 9, 1991

[54] INTEGRATION OF CERAMIC CAPACITOR

[75] Inventor: Kyle Anderson, Rockford, Ill.

[73] Assignee: Sundstrand Corporation, Rockford, Ill.

[21] Appl. No.: 458,407

[22] Filed: Dec. 28, 1989

[51] Int. Cl.⁵ .................. H05K 1/18; H05K 7/20
[52] U.S. Cl. .................... 361/321; 361/386; 361/401; 357/74
[58] Field of Search ............... 361/306, 321, 320, 386, 361/401; 174/52 FP; 357/51, 74, 75, 80

[56] References Cited

U.S. PATENT DOCUMENTS

| 3,585,455 | 6/1971 | Naylor | 361/386 X |
|---|---|---|---|
| 3,904,262 | 9/1975 | Cutchaw | 361/321 X |
| 4,281,361 | 7/1981 | Patz et al. | 361/401 |
| 4,320,438 | 3/1982 | Ibrahim et al. | 361/401 |
| 4,654,694 | 3/1987 | Val | 361/321 |
| 4,745,456 | 5/1988 | Clemens | 361/386 X |
| 4,788,584 | 11/1988 | Hirano et al. | 357/81 |
| 4,931,906 | 6/1990 | Reifel et al. | 361/401 X |

FOREIGN PATENT DOCUMENTS 56-8854A 1/1981 Japan.
59-136962A 8/1984 Japan.

OTHER PUBLICATIONS

I.B.M. Technical Disclosure Bulletin, Jun. 1978, vol. 21, No. 1, pp. 138, 361–386.

Primary Examiner—Donald A. Griffin
Attorney, Agent, or Firm—Marshall, O'Toole, Gerstein, Murray & Bicknell

[57] ABSTRACT

A power module consisting of electronic components disposed within a hollowed-out, hermetically-sealed, multi-layered ceramic capacitor formed of spaced side walls of stacked alternating layers of conductors and dielectrics, the side walls being covered by top and bottom covers.

21 Claims, 3 Drawing Sheets

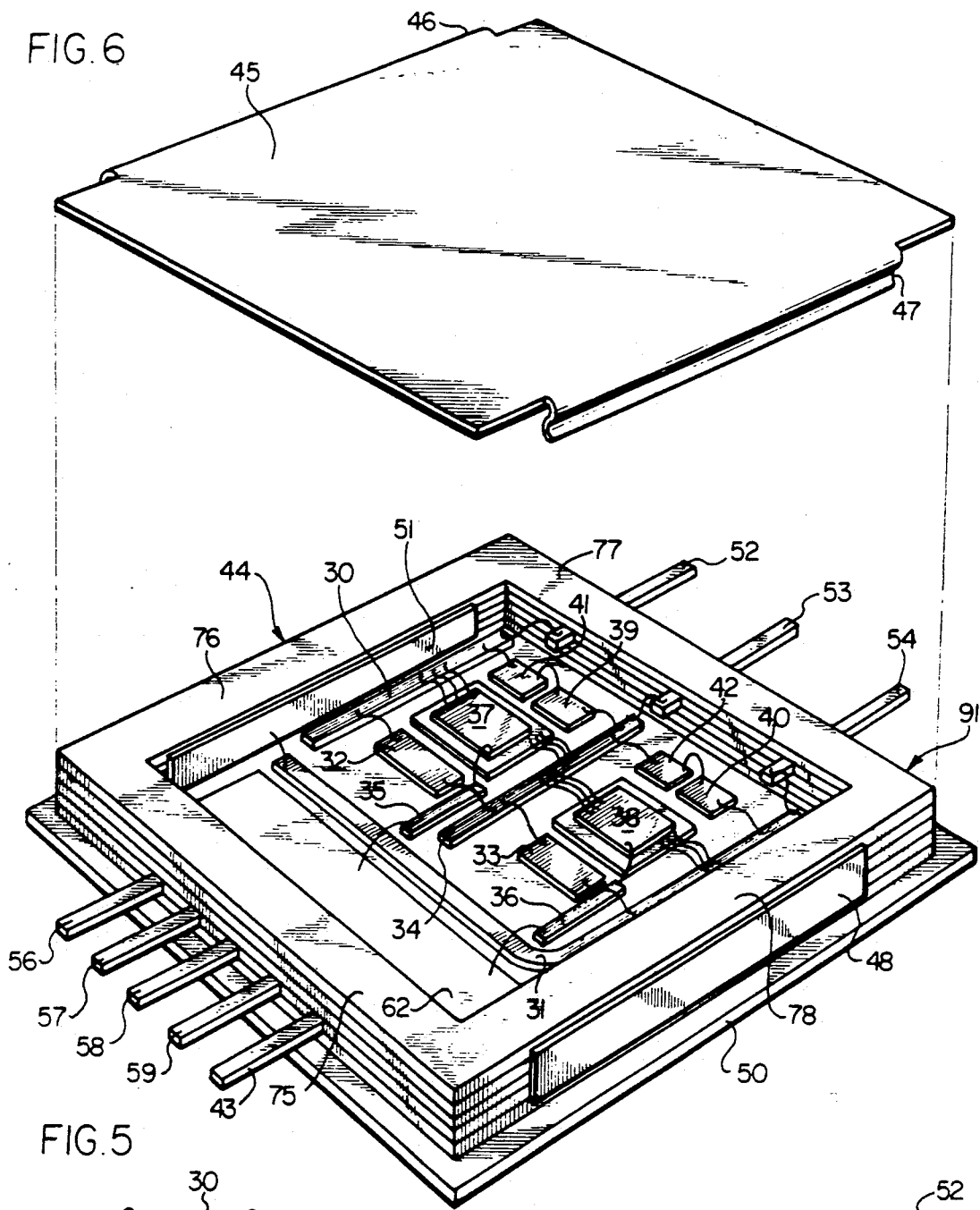
FIG. 6
FIG. 5
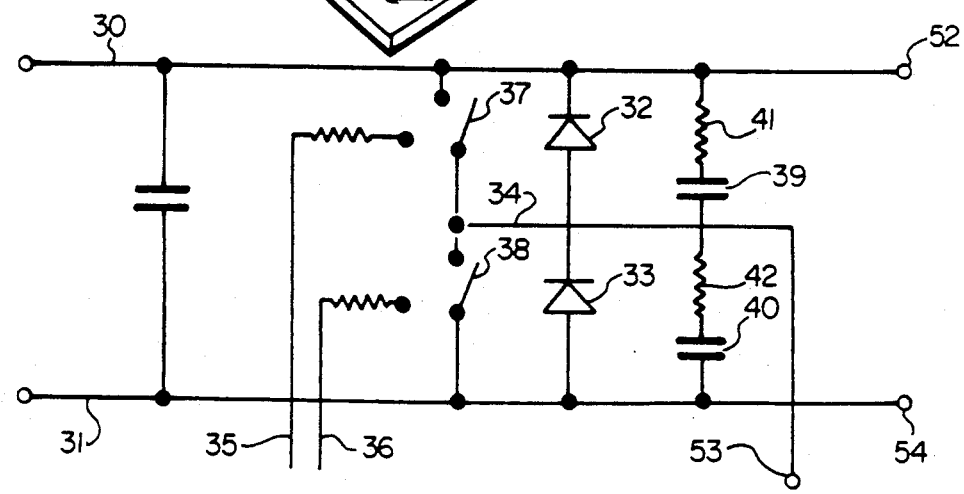

«5,031,069»

INTEGRATION OF CERAMIC CAPACITOR

FIELD OF INVENTION

The present invention relates generally to capacitor-containing electric devices, and more particularly to a power module consisting of the components of an electric device disposed within a hollowed out multi-layered ceramic capacitor which is hermetically sealed.

BACKGROUND OF THE INVENTION

Multi-layered capacitors are well known in the art. Prior art capacitors generally are constructed having a uniform solid cross section. A number of these capacitors are utilized in applications such as in a DC link where high currents in the magnitude of one hundred amps and above are generated. These substantial currents serve to generate excessive heat built-up within the capacitor. Unfortunately, excessive heat built-up in a capacitor causes the capacitor to fail over a relatively short period of time. Prior art capacitors typically first experience failure near the center area of the capacitor because the capacitor is unable to adequately dissipate heat in that area. The capacitor will reach a temperature at which physical destruction and/or loss of function occurs at least in the center portion of the capacitor.

Further, there exists a need for hermetically sealed electric devices in various applications such as in the aerospace and military fields where various components must be properly sealed from particular environmental conditions.

What is desired is a capacitor which has the ability to dissipate heat readily thereby avoiding failure due to excessive heat occurring in the center area of the capacitor.

Additionally, it is desired to have a device which can be hermetically sealed thereby protecting the components and circuitry that may exist within the capacitor body.

It is also desired that such device be modular for ease of installation and replacement. A "module" is a compact assembly functioning as a component of a larger unit. More particularly, the module per the present invention is a self-contained section or unit, detachable from a larger system, with a specific purpose or function.

SUMMARY OF THE INVENTION

The present invention is directed to an electric device which serves to resolve the problems associated with prior art capacitors and achieves the desired advantages referenced above. The module disclosed and claimed herein is adapted to be used in applications where high currents in the magnitude of one hundred amps are generated such that excessive heat often occurs in the capacitor.

Briefly, the invention claimed herein involves a power module which includes various electrical or electronic components disposed in a hollow center section which is bounded at the section periphery by capacitor layers. Some or all of the peripheral sections of the device are constructed to function as a capacitor. Such capacitor construction overcomes the prior art problem of heat dispersion from the inner areas of the capacitor and inhibits capacitor failure due to excessive heat build-up. Locating the capacitor at the periphery of a hollow center section makes possible a capacitor construction which has thermal paths of reduced length as compared with prior art capacitor devices where the heat to be dissipated was unable to pass from the capacitor in an appropriate period of time such that capacitor failure occurred. Additionally, the hollowed-centered construction of the present invention provides an increased surface area from which excess heat can be dissipated from the capacitor.

Moreover, the hollow center of the capacitor device provides a reservoir into which electronic or other components can be placed, and the device can readily be hermetically sealed from the surrounding environment. Accordingly, an inverter, full phase switching assembly or other electric device can be constructed as a module whereby the capacitor surrounds and protects the components within, and also serves as an outer wall of a module. For example, a circuit board with various electronic components disposed thereon, e.g. switches, diodes, transistors, can be positioned in the hollow center section or reservoir of the capacitor body. The top and bottom of the capacitor device also are covered, thereby hermetically sealing the components disposed within the hollow center.

The capacitor is layered with several alternating dielectric and conductor layers. The top and bottom capacitor cover plates preferably are ceramic or cold welded metal. As per the prior art, the inside and outside peripheral edges of the capacitor can be covered with a layer of solder. In preferred embodiments, the dielectric layers may be ceramic.

If desired for a particular application, a feed-through conductor may be extended through a side wall of the device to electrically connect the components sealed inside the module to circuitry or controls located outside the module. The feed-through conductor is electrically insulated from the layers of any capacitor section it may pass through.

Modules constructed according to the present invention also are especially useful as power converters. The comparatively large-sized capacitors used in power converters are especially amenable to being constructed according to the present invention to serve as the outside wall of a hermetically sealed module.

A better understanding of the invention will become apparent from a review of a brief description of the drawings and detailed description of the invention.

BRIEF DESCRIPTION OF THE DRAWINGS

FIG. 5 shows a schematic of a full phase switching assembly;

FIG. 6 shows an exploded perspective view of an embodiment of the invention in which the module functions as a full phase switching assembly;

DETAILED DESCRIPTION OF THE INVENTION

Figure 1:
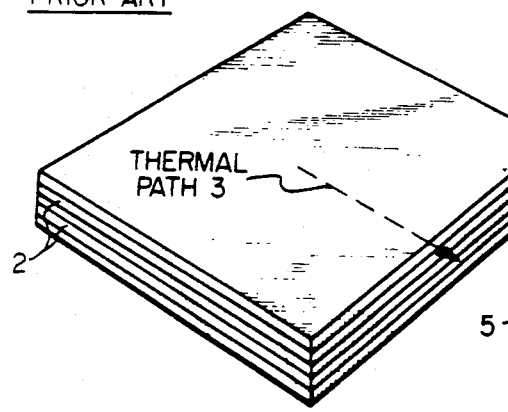
FIG. 1 shows a perspective view of a prior art multi-layered ceramic capacitor.

Referring to the drawings, FIG. 1, shows a prior art capacitor comprising a plurality of stacked multiple layers. The layers alternate between conductor layers 1 and dielectric layers 2. When a capacitor having this general stacked layer construction is used, particularly in an application utilizing relatively large currents, a substantial amount of heat is generated. It has been found that the heat existent at the center area of the capacitor is not always able to be dissipated satisfactorily. Excessive heat build up occurs in the capacitor center section such that the capacitor relatively quickly deteriorates and ultimately fails in its required performance. It can be seen from FIG. 1 that this type of prior art capacitor has a relatively long thermal path 3 for heat to travel from the center of the capacitor to the edge of the capacitor where the heat is dissipated to the atmosphere or other environment.

Figure 2:
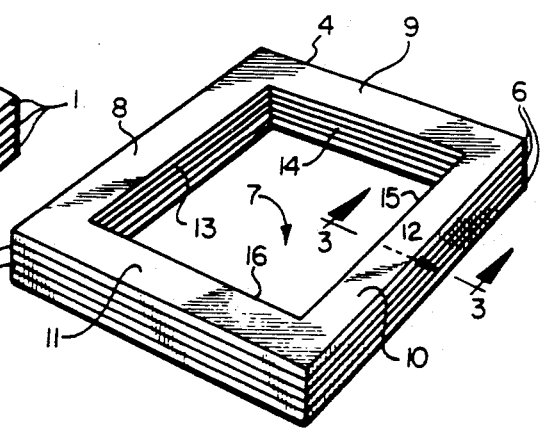
FIG. 2 shows a simplified, perspective view of a multi-layered ceramic capacitor having a hollow center in accordance with the present invention.

FIG. 2 shows the basic construction of a capacitor for use in the present invention. Capacitor 4 comprises a multi-layered structure and includes alternating ceramic layers 5 and conductor layers 6. The capacitor includes a hollow center section 7 bounded by four spaced walls 8, 9, 10 and 11. In the particular embodiment shown in FIG. 2, each capacitor wall is of the same length and width.

By eliminating the center section of the capacitor, it has been found that the heat problem, which is most critical at the center of the capacitor, is alleviated. Moreover, heat can be dissipated relatively easily due to the fact the capacitor wall widths have been reduced substantially from the prior art embodiment of FIG. 1. The thermal paths 12 whereby heat exits the capacitor structure are considerably shorter in the capacitor construction of FIG. 2 than similar paths 3 in the solid prior art capacitor of FIG. 1. Further, additional surface area is created in the capacitor construction of the present invention by the elimination of the center area of the capacitor. Surface area is created on the inside surfaces 13, 14, 15 and 16 of walls 8, 9, 10 and 11. The increased surface area permits heat to travel from the middle of the respective capacitor walls to both the inner and outer wall surfaces where heat is dissipated to the atmosphere or conveyed to another medium.

As illustrated in the drawings, the capacitor of FIG. 2 has less capacitance than that of the capacitor of FIG. 1 owing to the fact that it has less area due to the elimination of its center portion. In order for the capacitor of FIG. 2 to have the same capacitance as that of FIG. 1, the hollowed capacitor can be constructed with increased peripheral dimensions as compared to the conventional solid capacitor of FIG. 1. This increased physical size of the capacitor permits the hollow-centered capacitor to readily serve as an enclosure for a module.

The walls of the module of the present invention can also be constructed with non-capacitor portions. Such portions would have the same height as the capacitor wall portions but would not necessarily have the same width or length. The non-capacitor wall sections would typically be constructed of ceramic. Use of non-capacitor wall portions can facilitate construction of side walls of an ideal size to contain the desired components inside.

Figure 3:
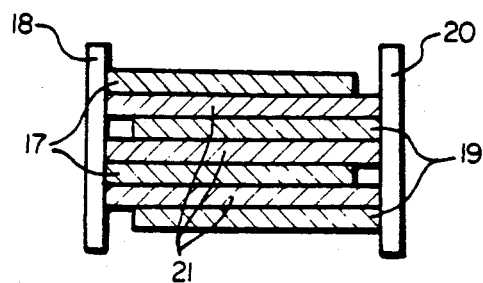
FIG. 3 shows a partial front section view of a hollow-centered capacitor of the present invention taken along line 3—3 in FIG. 2.

The capacitor cross section of FIG. 3 shows a plurality of spaced conductive plates 17 each connected at one end to a positive conductor 18. A plurality of spaced conductive plates 19 are similarly attached to negative conductor element 20. Plates 17 and 19 are parallel and spaced from each other by dielectric layers 21.

Figure 4:
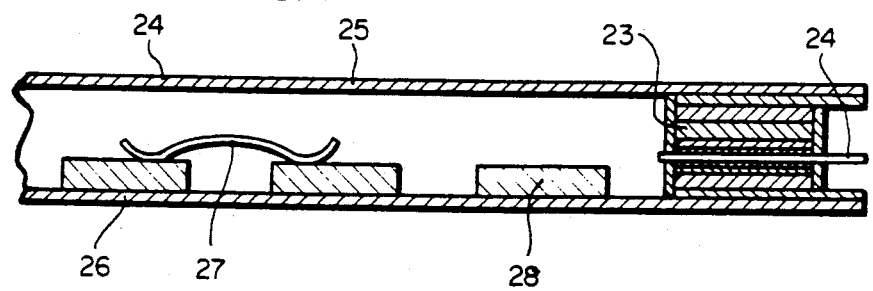
FIG. 4 shows a partial front section view of a module of the present invention which includes several electronic components located within the sealed center portion of the body.

FIG. 4 shows a partial cross section of a power module of the present invention showing a non-capacitor structural wall containing a feed through lead 29. Such conductor would preferably be run through any non-capacitor portion of a side wall. The side wall 23, one of two similar walls comprises a non-capacitor structure and serves as a protective side wall for module 24.

Cover 25 of module 24 is mounted to the top surface of the side walls whereas cover 26 is mounted to the bottom surface of the side walls. The covers and side walls serve to hermetically seal typical components 27, 28 disposed within the capacitor module 24. A feedthrough conductor 29 is shown extending through the non-capacitor side wall 23. Lead 29 connects the electronic components 27, 28 within the device with circuitry or controls located outside of the module. Further, electric circuitry (not shown) within the module connects the components of the module into the desired configuration.

Various components can be mounted within the power module of the present invention depending on the desired function of the device.

In one embodiment of the invention, the module can be utilized as a power converter. A power converter is a system of components which converts DC power supplied on a DC rail into AC power, or, more particularly, converts variable frequency electrical power developed by a generator driven by a variable speed prime mover into constant frequency power for AC loads. See co-pending application Ser. No. 07/448,311 filed Dec. 11, 1989 entitled "VSCF Power Conversion System Using An Output Autotransformer" and assigned to the assignee of the instant application, the disclosure of which is hereby incorporated by reference. A module of the present invention lends itself well to use as a leg of a polyphase inverter in such a system. Devices with such function are often referred to as "switch circuits" or "switching assemblies".

Figure 7:
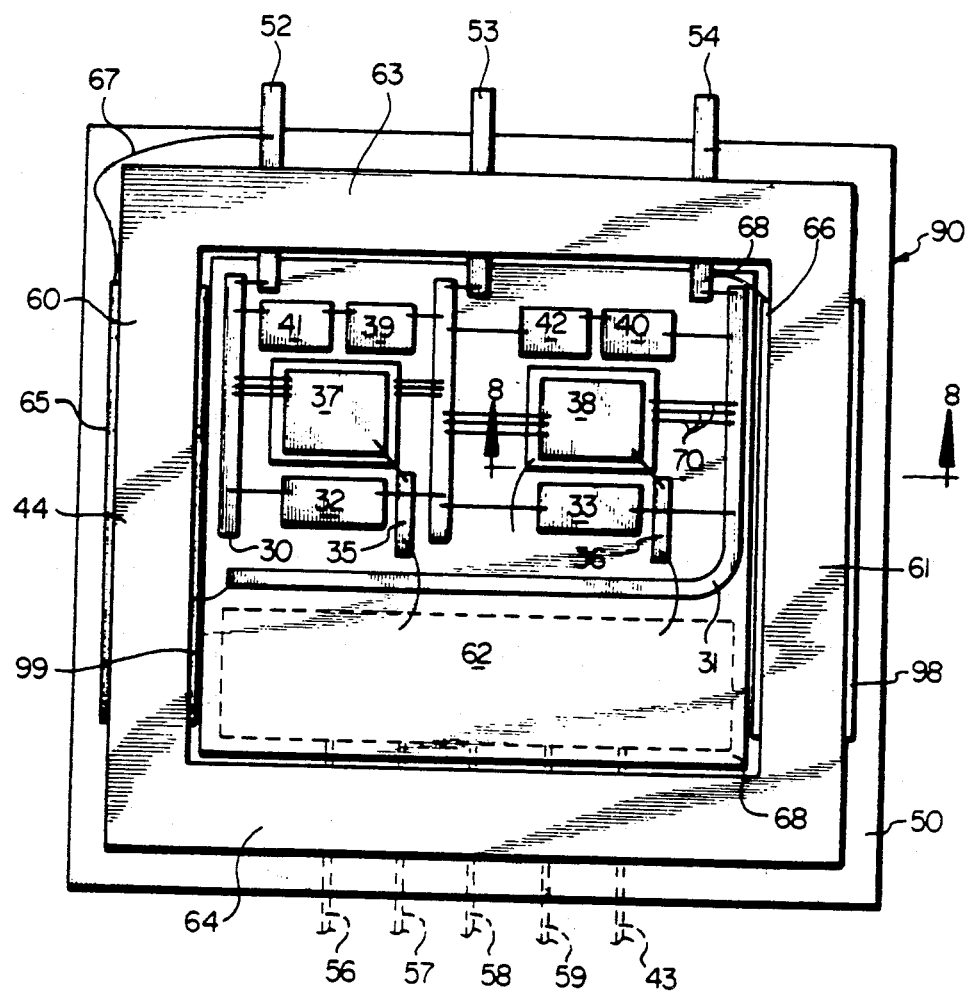
FIG. 7 shows a combined electrical and mechanical block diagram of another embodiment in which the module functions as a full phase switching assembly; and, FIG. 8 shows a partial front section view of the module taken along lines 8—8 in FIG. 7.
Figure 8:
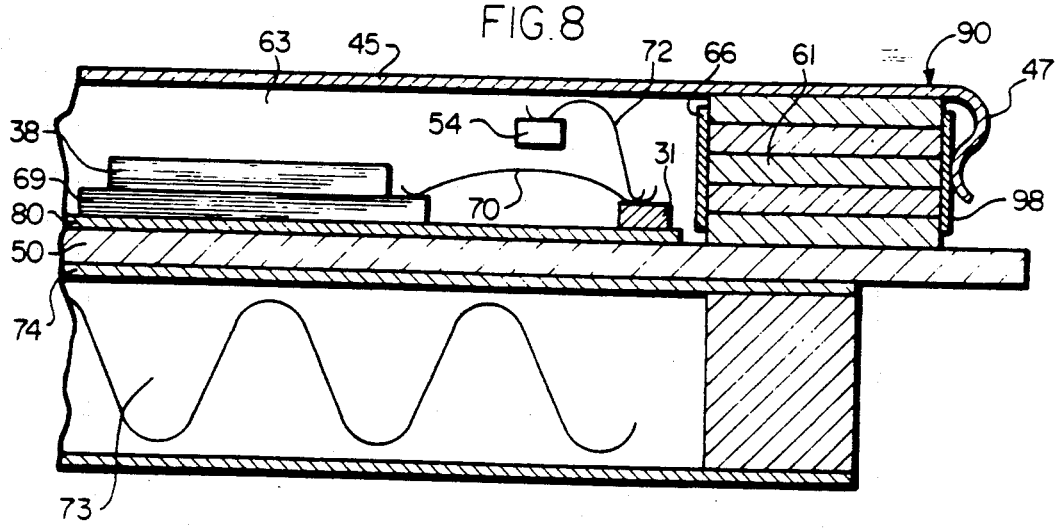

FIGS. 5, 6, 7 and 8 show various views of power converters configured as full phase switching assemblies constructed in the hermetically sealed power modules of the present invention. Full phase switching assemblies are especially amenable to construction in the modules of the present invention as the various components of the assembly can readily be disposed within the relatively large DC link capacitor utilized in such circuits. The modules of FIGS. 6, 7 and 8 are constructed utilizing the hollowed-centered, spaced capacitor side wall construction of FIG. 2 and 3 wherein capacitor side walls also serve as module sidewalls.

FIG. 5 shows a schematic layout of the circuitry of the full phase switching assembly of FIGS. 6, 7 and 8. The positive power lead 30 and negative power lead 31 run along the top and bottom of the diagram respectively. The power switches 37 and 38 are connected from the power leads to a central junction 34. Conductor strips 35, 36 for gate drive, extend from the control circuit, located within the module, to the switches. Flyback diodes 32 and 33 are connected between the power leads and the central junction. Snubber units, each consisting of one or more snubber capacitors 39, 40 and one or more resistors 41, 42, also connect between the power leads and the central junction. The central junction 34 runs to an output lead for a phase signal 53. Leads 52 and 54 extend to power leads 30 and 31.

A DC link capacitor 44 is connected between the power lead 30 or 31 on the inside of the module, and lead 52 or 54 on the outside of the module. In practical applications, the DC link capacitor is a relatively large sized capacitor, and can readily be constructed with the hollow center of the present invention. FIG. 6 shows an embodiment of the module 91 wherein capacitor 44 is formed by two spaced capacitor side walls 76 and 78.

In FIG. 6, top cover 45 comprises a conductive material and is shaped with lips 46, 47 curled downward to abut conductive plate 48 on the outside of capacitor side wall 78. A corresponding plate on opposite side wall 76 is not shown. These plates are electrically connected to both the positive external lead 52. Bottom cover 50, which comprises a non-conductive material, is shown as a conductive plate upon which is mounted a circuit board upon which various electronic components are positioned. Alternatively, bottom cover 50 could comprise a conductive material with an attached circuit board. Conductive plate 51 is mounted on the inside of capacitor side wall 76. The corresponding plate on the opposite side of the capacitor 78 is not shown. These plates are electrically connected to the negative lead 31. Output leads 52, 53, 54 each extend through non-capacitor side wall 77. Similarly, control leads 43, 56, 57, 58, 59 each extend through the opposite non-capacitor side wall 75.

The components of the module, as shown schemetically in FIG. 5, include power switches 37, 38, flyback diodes 32, 33, snubber capacitors 39, 40, and resistors 41, 42. The components are connected between the power leads 30, 31 and to central junction 34. Power leads 30, 31 and central junction 34 are electrically connected to the output leads 52, 53, 54. The gate drive leads 35, 36 are run from control circuit 62 to the power switches 37, 38. For the sake of simplicity, the electric circuitry connections between the input leads 43, 56, 57, 58 and 59, the control circuit and various components inside the module are not shown.

FIG. 7 shows a simplified mechanical and electrical block diagram of an embodiment of a switching assembly module of the present invention 90 including a conductive bottom cover. A DC link capacitor 44 for the module of FIG. 7 is comprised of two spaced side walls 60, 61. The remaining two non-capacitor side walls 63, 64 forming the module 90 are constructed of layered ceramic. The input and output leads 43, 52-54, 56-59 extend through the layered ceramic side walls for ease of manufacture and to minimize insulation problems.

The full phase switching assembly of FIG. 7, used as a leg of an inverter, is coupled across power leads 30 and 31, which serve as the DC rails for the DC link. The assembly includes two associated switches 32 and 33. The switches are coupled together at switch junction 34.

The device also includes a pair of flyback diodes 37, 38, a pair of snubber capacitors 39, 40, and a pair of resistors 41, 42 configured as shown in the diagram of FIG. 5. The module contains three output leads 52, 53, 54, and five input leads 43, 56, 57, 58 and 59.

During operation, DC power is filtered by DC link capacitor 44 coupled to the power leads 30 and 52. Such coupling is accomplished by connections to the capacitor wall sections 60, 61. The attached conductor plates 99 and 66 are wire bonded to conductor 31. Connector 67 electrically connects cover 45 (FIG. 6) and power output lead 52. Cover 45 is subsequently electrically attached to conductors 98 and 65.

The power switches 37, 38 of the inverter are operated by a control circuit 62 in response to sensed parameters of the system so that AC power is produced at the switch junctions between leads 52 and 53, and leads 53 and 54. During operation the switch networks are operated in parallel to produce constant frequency AC power. Multiple devices can be operated in a switching sequence which causes generation of multiphase AC waveforms, each of which approximates a sinusoid.

The control unit 62 is shown in outline with broken lines for the sake of simplicity. The type of control unit used depends on the use of the module and the budgetary constraints. The control unit can consist of a circuit board or a special IC chip.

FIG. 8 shows a partial front section view of the preferred embodiment full phase switch module of the present invention shown in FIG. 7. DC link capacitor 61 serves as a peripheral side wall of the module 90, and has a positive conductor 98 along its outside edge and a negative conductor 66 along its inside edge. Top cover 45 is formed to fit over the capacitor wall 61. Top cover lip 47 is downturned to contact conductor 98 on the outside edge of capacitor wall 61. A bottom cover 50, shown made of molybdenum, is attached to the bottom of side wall 61. A substrate insulator 80 is mounted on bottom cover 50 and fits inside the space within module 90 and electrically insulates the electronic components and circuitry of the device from bottom cover 50. A power bus 31 is mounted on the substrate insulator 80 to transport current to or from the components of the device. A conductive plate 69, made of molybdenum, is mounted on substrate insulator 80 and is electrically coupled by connector 70 to power bus 31. Power switch 38, comprising an insulated gate bipolar transistor (IGBT), is mounted on top of conductive plate 69.

Feed-through conductor 54, made of a conductive material with an appropriate coefficient of expansion, such as Kovar, extends through ceramic module wall 63. Conductor 54, which is electronically connected via connector 72 to power bus 31, serves as one of the output leads for the device. Kovar, or another suitable material having a coefficient of thermal expansion approximating that of the walls of the module, is used for the feed-through conductor so that the conductor and module side walls tend to expand and contract at the same rate with respect to heat fluctuations in the device, thereby minimizing stresses created by expansion or contraction at different rates.

Additional means also may be added to the module to act as a heat sink or heat dissipator. For example, a heat exchanger 73, preferably made of aluminum, may be disposed below bottom 50, in FIG. 8. A layer of solder 74 serves to connect exchanger 73 to bottom cover 50. The heat exchanger 73 may function to absorb and dissipate heat from module 90.

While one or more embodiments of the invention have been herein illustrated and described in detail, it will be understood that modifications and variations thereof may be effected without departing from the spirit of the invention and the scope of the appended claims.

What is claimed is:

1. A hermetically sealed power module device comprising:
   side walls formed of spaced sections which bound an opening, at least one such wall comprising a capacitor of stacked alternating layers of conductors and dielectrics;
   electrical components disposed within said opening;
   a first conductor element disposed on an outer peripheral edge of said capacitor side wall;
   a second conductor element disposed on an outer peripheral edge of another of said side walls; and
   top and bottom covers each disposed on said side walls hermetically sealing said components within said opening, at least one of said covers being made of a conductive material and having a plurality of lips contacting said conductor elements.

2. The device of claim 1 in which said capacitor includes means for dissipating heat build-up in said capacitor.

3. The device of claim 2 in which said dissipating means includes said spaced sections.

4. The module of claim 1 in which said dielectric layers are made of ceramic.

5. The module of claim 1 in which at least one cover is made of molybdenum.

6. The module of claim 1 in which a circuit board having one or more electric components serves as one of said covers.

7. The module of claim 1 in which a cover is attached by means of solder to a wall formed by the capacitor body.

8. The module of claim 1 in which one side of said capacitor is covered with solder.

9. The module of claim 1 in which a heat sink is mounted on an outside surface of said module.

10. The module of claim 1 in which a heat exchanger device is attached to an outside surface of a cover.

11. The one module of claim 1 in which electric circuitry elements are disposed within said opening; said elements being adapted to connect said electric components into the desired circuit configuration.

12. The module of claim 11 in which the electric circuitry elements include means for controlling the function of the components disposed within the module.

13. The module of claim 11 in which the electric circuitry elements include a feed-through conductor passing through one of said side walls from said opening inside the module walls to outside the module.

14. The module of claim 13 in which the feed-through conductor is made of a material having a coefficient of thermal expansion approximating the coefficient of thermal expansion of said ceramic material.

15. The module of claim 1 in which one of said electrical components is mounted on a small conductive plate, said plate being attached to the inner surface of and electrically insulated from a cover.

16. The module of claim 1 in which said components comprise a power converter configured as a full phase switching assembly.

17. The module of claim 16 in which said capacitor functions as a DC link capacitor.

18. The module of claim 16 in which a plurality of said components are disposed within said opening and said components include a power switch, a flyback diode, a resistor, and a snubber capacitor.

19. The module of claim 16 and further comprising a positive current lead, a negative current lead, and a phase lead.

20. The module of claim 16 which has control leads comprising a drive control lead, an internal power supply control lead or an overload protection control lead.

21. The module of claim 16 in which said power switches comprise insulated gate bipolar transistors, bipolar transistors, thyristors or power FETs.

* * * * *